(12) United States Patent
Wei et al.

(10) Patent No.: US 10,957,594 B2
(45) Date of Patent: Mar. 23, 2021

(54) MANUFACTURING METHOD OF SEMICONDUCTOR CHIP

(71) Applicant: Winbond Electronics Corp., Taichung (TW)

(72) Inventors: Cheng-Hong Wei, Taichung (TW); Hung-Sheng Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/152,419

(22) Filed: Oct. 5, 2018

(65) Prior Publication Data

US 2020/0111707 A1    Apr. 9, 2020

(51) Int. Cl.
*H01L 21/027* (2006.01)
*H01L 21/78* (2006.01)
*H01L 23/544* (2006.01)
*H01L 21/3065* (2006.01)
*H01L 21/3213* (2006.01)

(52) U.S. Cl.
CPC .......... *H01L 21/78* (2013.01); *H01L 21/0274* (2013.01); *H01L 21/3065* (2013.01); *H01L 21/32139* (2013.01); *H01L 23/544* (2013.01); *H01L 2223/54426* (2013.01)

(58) Field of Classification Search
CPC .................................................. H01L 21/0274
USPC .......................................................... 438/462
See application file for complete search history.

(56) References Cited

U.S. PATENT DOCUMENTS

| | | | |
|---|---|---|---|
| 7,696,607 B2* | 4/2010 | Sano .................... | H01L 21/78 257/620 |
| 2009/0108410 A1* | 4/2009 | Takemura ............ | H01L 23/585 257/620 |
| 2014/0183681 A1* | 7/2014 | Jangjian ............ | H01L 27/14685 257/437 |
| 2017/0179044 A1 | 6/2017 | Hsu et al. | |
| 2018/0240697 A1* | 8/2018 | Okita ................ | H01L 21/30655 |

FOREIGN PATENT DOCUMENTS

| | | |
|---|---|---|
| TW | 201543631 | 11/2015 |
| TW | 201812894 | 4/2018 |

OTHER PUBLICATIONS

"Office Action of Taiwan Counterpart Application," dated Jul. 23, 2019, p. 1-p. 5.

* cited by examiner

*Primary Examiner* — Hsin Yi Hsieh
(74) *Attorney, Agent, or Firm* — JCIPRNET (57) ABSTRACT

A manufacturing method of a semiconductor chip is provided. The method includes: forming a first metal pattern over a substrate and within a chip region and a scribe line region of the substrate, wherein the chip region is surrounded by the scribe line region; forming a metal material layer on the first metal pattern; patterning the metal material layer to remove substantially all portions of the metal material layer within the scribe line region and a portion of the metal material layer within the chip region, so as to form a second metal pattern within the chip region; forming a third metal pattern, wherein the second metal pattern within the chip region is covered by the third metal pattern, and the third metal pattern is located over the first metal pattern within the scribe line region; and performing singulation along the scribe line region, to form the semiconductor chip.

12 Claims, 7 Drawing Sheets

MANUFACTURING METHOD OF SEMICONDUCTOR CHIP

BACKGROUND

Technical Field

Embodiments of the present invention relates to a manufacturing method of a semiconductor chip.

Description of Related Art

Current wafer dicing technique includes mechanical dicing, laser dicing, plasma dicing and the like. Along with scaling on critical size of semiconductor devices, an amount of semiconductor chips formed in each semiconductor wafer continuously increases. As such, process time of mechanical dicing or laser dicing increases significantly. Therefore, attention paid on plasma dicing that is featured as short process time has gradually grown in recent years.

However, the process of plasma dicing would be hindered when there is metal or metal alloy (e.g., Al or Al alloy) difficult to be etched or possible to generate a barely etchable byproduct disposed in scribe line regions of the semiconductor wafer. On top of that, yield of semiconductor chip packaging would be influenced.

SUMMARY

A manufacturing method of a semiconductor chip provided in the present invention allows the plasma dicing to be successfully performed, such that an yield of semiconductor chip manufacture can be improved.

The manufacturing method of the semiconductor chip according to some embodiments of the present invention comprises: forming a first metal pattern over a substrate, wherein the first metal pattern is located within a chip region and a scribe line region of the substrate, and the chip region is surrounded by the scribe line region; forming a metal material layer over the first metal pattern; patterning the metal material layer, to remove substantially all portions of the metal material layer located within the scribe line region and a portion of the metal material layer located within the chip region, so as to form a second metal pattern located within the chip region; forming a third metal pattern, wherein the third metal pattern covers the second metal pattern within the chip region, and is located over a portion of the first metal pattern located within the scribe line region; and performing a singulation along the scribe line region, so as to form the semiconductor chip.

In some embodiments, a method of patterning the metal material layer comprises: forming a photoresist layer over the metal material layer; performing a first exposure on the photoresist layer, such that the photoresist layer has a first dissolvable region, wherein a distribution range of the first dissolvable region is overlapped with the chip region and the scribe line region; performing a second exposure on the photoresist layer, such that the photoresist layer further has a second dissolvable region, wherein the second dissolvable region is located within the scribe line region; performing a development, to remove the first dissolvable region and the second dissolvable region of the photoresist layer, so as to expose the metal material layer; removing the exposed portion of the metal material layer by using the remained portion of the photoresist layer as a mask, so as to form the second metal pattern; and removing the remained portion of the photoresist layer.

In some embodiments, the photoresist layer comprises a positive-tone photoresist material.

In some embodiments, the first dissolvable region is not overlapped with the second dissolvable region.

In some embodiments, a distribution range of the second dissolvable region is not overlapped with the chip region.

In some embodiments, an area of the scribe line region is substantially equal to a total area of the second dissolvable region and a portion of the first dissolvable region located within the scribe line region.

In some embodiments, the third metal pattern is electrically connected with the second metal pattern within the chip region.

In some embodiments, a method of performing the singulation comprises a plasma dicing process.

In some embodiments, a material of the second metal pattern comprises Al.

In some embodiments, materials of the first metal pattern and the third metal pattern comprise W.

In some embodiments, the manufacturing method of the semiconductor chip further comprises: repeating the step of forming the metal material layer and the step of patterning the metal material layer a plurality of times, wherein the same photomask is applied for a plurality of times of the second exposure.

As above, the material within the scribe line region that may hinder an etching process is removed during the formation of the semiconductor chip according to embodiments of the present invention, so that the singulation process (e.g., plasma dicing) can be successfully performed. Therefore, yield and throughput of the manufacture process of the semiconductor chip is improved. In some embodiments, a method of removing this material within the scribe line region includes two exposure steps. The first exposure step is applied for defining an initial pattern of this material within both of the chip regions and the scribe line region, and the second exposure step is applied for removing a portion of this pattern within the scribe line region. Accordingly, a final pattern only remained within the chip region, and is substantially absent within the scribe line region. In these embodiments, only an additional exposure process is required for removing this material from the scribe line region, and modification on the existing photomask is not required. In addition, a predetermined pattern of this material within the chip regions is not influenced. As a result, it can be avoided from greatly raising manufacturing cost of the semiconductor chip.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
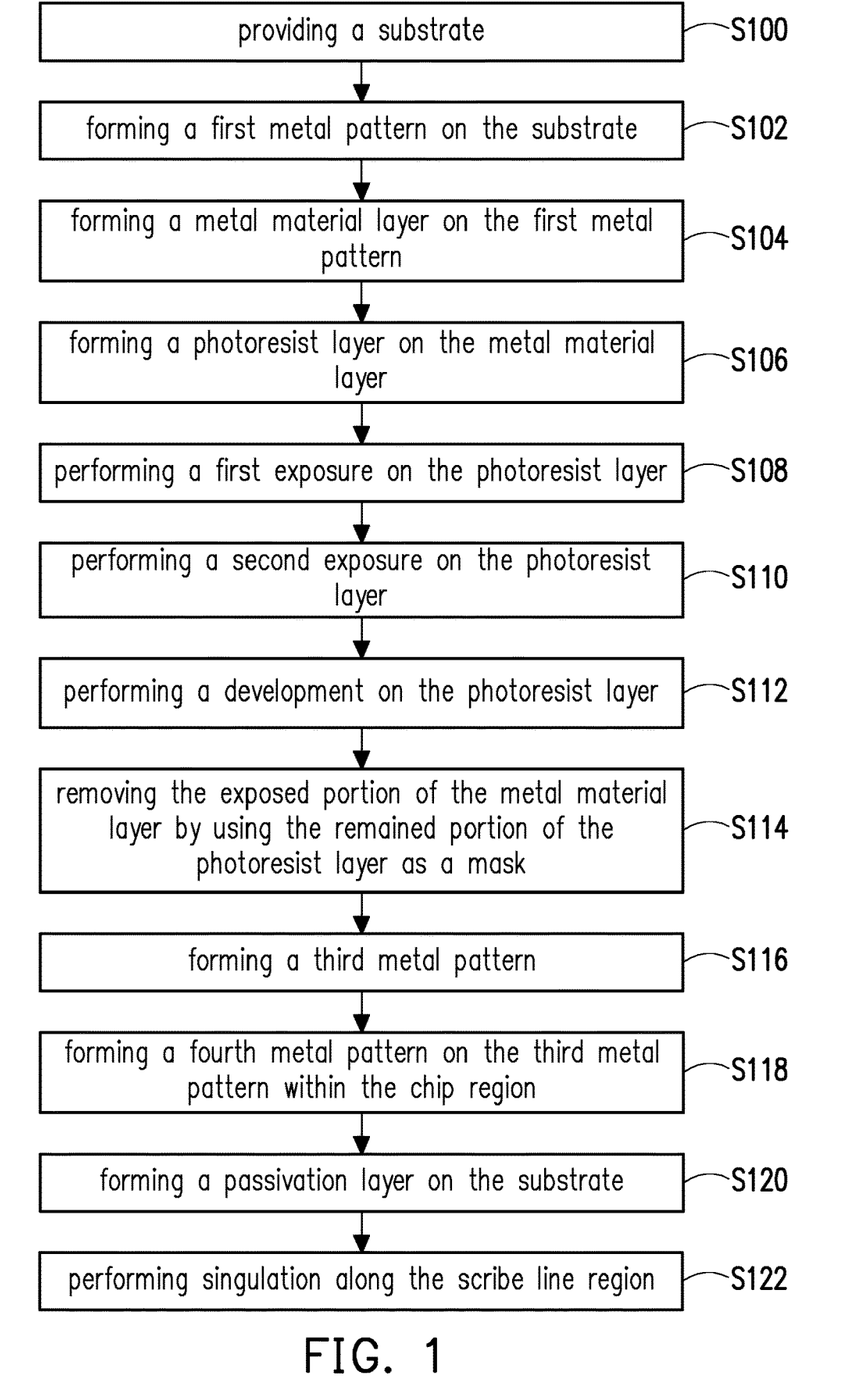
FIG. 1 is a process flow diagram illustrating a manufacturing method of a semiconductor chip according to some embodiments of the present invention.

FIG. 1 is a process flow diagram illustrating a manufacturing method of a semiconductor chip 10 according to some embodiments of the present invention. FIG. 2A through FIG. 2K are cross-sectional views illustrating structures at various stages of the manufacturing method of the semiconductor chip 10 according to some embodiments of the present invention.

Figure 2A:
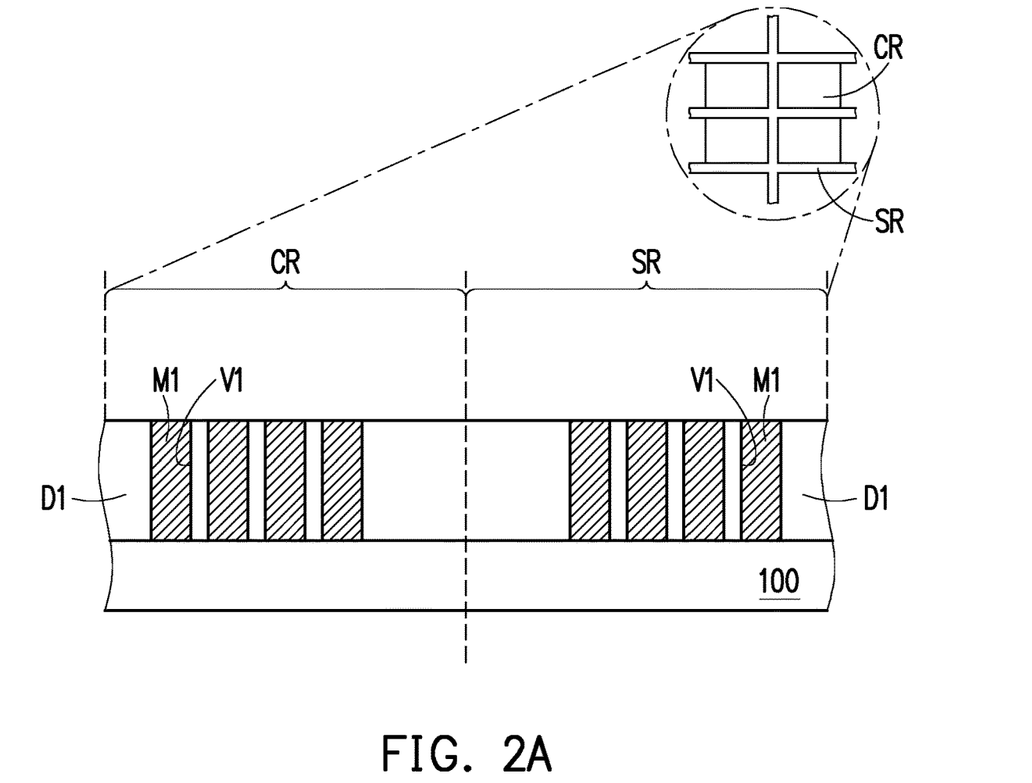
FIG. 2A through FIG. 2K are cross-sectional views illustrating structures at various stages of a manufacturing method of a semiconductor chip according to some embodiments of the present invention.

Referring to FIG. 1 and FIG. 2A, step S100 is performed, and a substrate 100 is provided. In some embodiments, the substrate 100 may be a semiconductor substrate or a semiconductor-on-insulator (SOI) substrate. A semiconductor material in the semiconductor substrate or the SOI substrate may include an element semiconductor or a compound semiconductor. For instance, the element semiconductor may include Si or Ge. The semiconductor alloy may include SiGe, SiC, SiGeC, group III-V semiconductor material or group II-VI semiconductor material. In some embodiments, the substrate 100 may be doped as a first conductive type or a second conductive type complementary to the first conductive type. For instance, the first conductive type may be N-type, and the second conductive type may be P-type. The substrate 100 may include chip regions CR and a scribe line region SR (shown as the area enclosed by a dotted line in FIG. 2A) surrounding each of the chip regions CR. The chip regions CR of the substrate 100 may be singulated to form semiconductor chips. In addition, in the steps of performing singulation, the substrate 100 may be diced along the scribe line region SR. In some embodiments, a plurality of electronic devices (not shown) are formed in and/or over the substrate 100 within the chip regions CR. The electronic devices may include active devices and passive devices. For instance, the active device may be a transistor, a diode or the like. The passive device is such as a resistor, a capacitor, an inductor or the like.

Step S102 is performed, and a first metal pattern M1 is formed on the substrate 100. A dielectric layer D1 may be formed on the substrate 100 before forming the first metal pattern M1. The dielectric layer D1 may be formed within the chip regions CR and the scribe line region SR. Thereafter, the dielectric layer D1 may be patterned, so as to form a plurality of openings V1 in the dielectric layer D1. Some of the openings V1 may be located within the chip regions CR, and the others of the openings V1 may be located within the scribe line region SR. Afterward, the first metal pattern M1 is formed in the openings V1. A formation method of the first metal pattern M1 may include filling a metal material into the openings V1. This metal material may extend onto a top surface of the dielectric layer D1 (not shown). Thereafter, a planarization process is performed to remove a portion of this metal material that is over the top surface of the dielectric layer D1, so as to form the first metal pattern M1. In some embodiments, a method of filling the metal material may include a plating process (e.g., an electroplating or an electro-less plating), a chemical vapor deposition (CVD) method or the like. In addition, the planarization process may be a chemical mechanical polishing (CMP) method. In some embodiments, the first metal pattern M1 may be a conductive plug or a conductive via. A material of the first metal pattern M1 may include W.

Figure 2B:
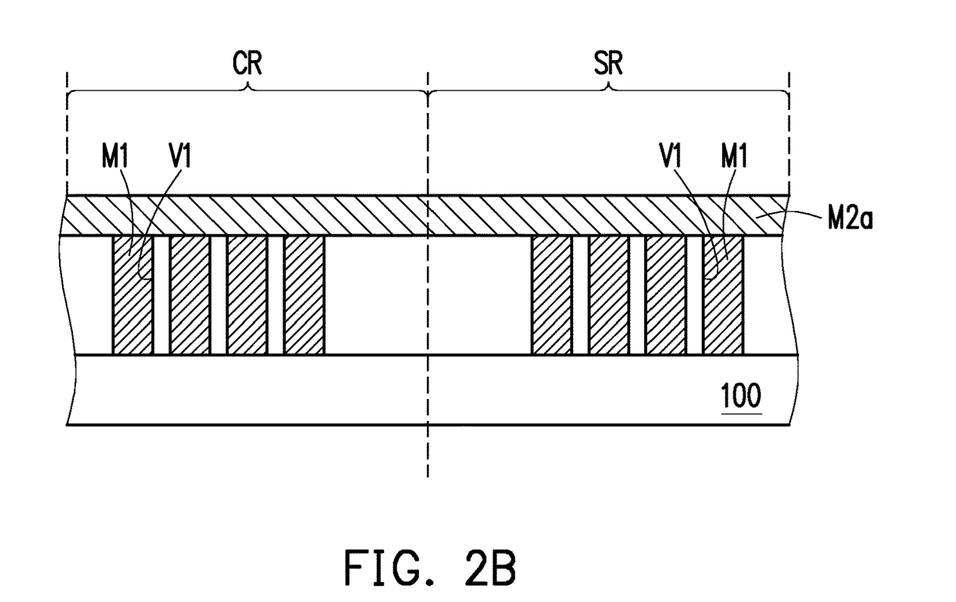

Referring to FIG. 1 and FIG. 2B, step S104 is performed, and a metal material layer M2a is formed on the first metal pattern M1. Portions of the first metal pattern M1 and the dielectric layer D1 covering the chip regions CR and the scribe line region SR are covered by the metal material layer M2a. In some embodiments, the metal material layer M2a may be formed by a plating process or a CVD method. A material of the metal material layer M2a includes a material that is difficult to be etched or possible to generate a barely etchable byproduct while being etched with a silicon-based material. For instance, the material of the metal material layer M2a may include Al.

Figure 2C:
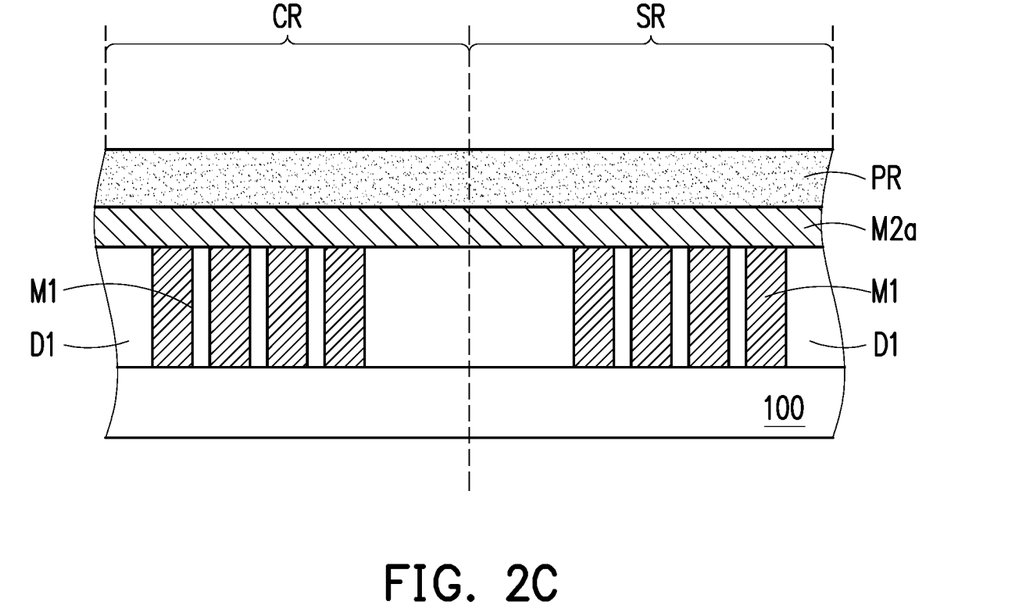

Referring to FIG. 1 and FIG. 2C through FIG. 2G, the metal material layer M2a is then patterned to form a second metal pattern M2. Referring to FIG. 1 and FIG. 2C, in some embodiments, a method of patterning the metal material layer M2a may include performing step S106, to form a photoresist layer PR on the metal material layer M2a. The photoresist layer PR is formed within the chip regions CR and the scribe line region SR. In some embodiments, the photoresist layer PR includes a positive-tone photoresist material. In other words, the photoresist layer PR is indissolvable before exposure.

Figure 2D:
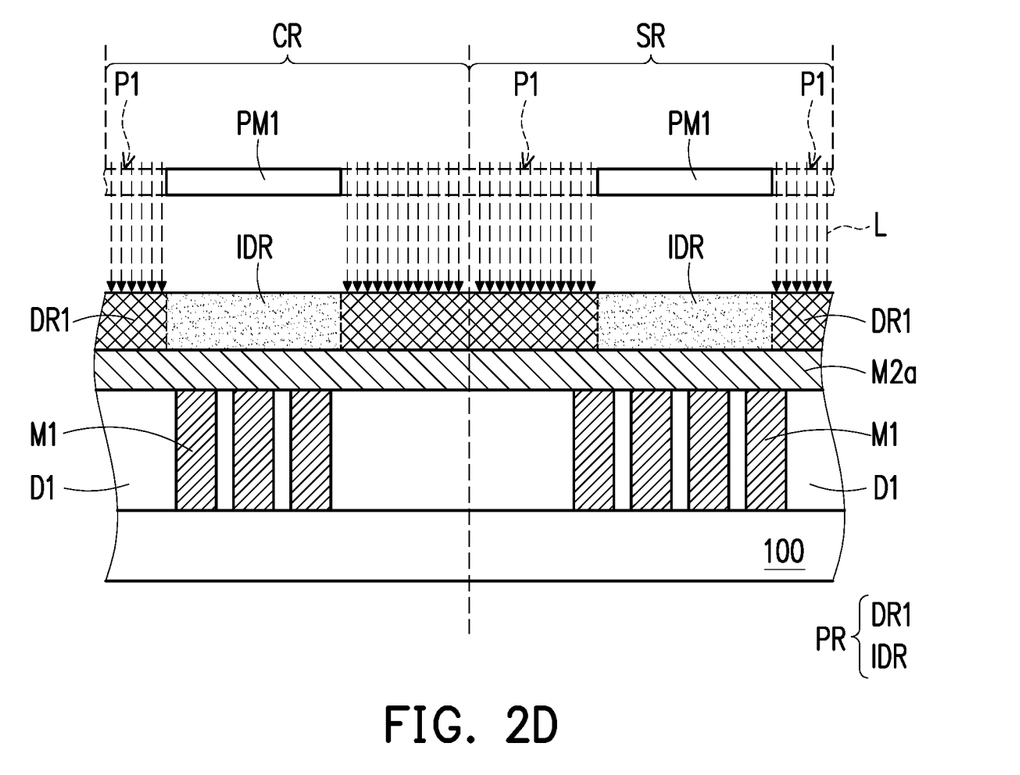

Referring to FIG. 1 and FIG. 2D, step S108 is performed, and a first exposure is performed on the photoresist layer PR. As such, the photoresist layer PR has a first dissolvable region DR1. After performing the first exposure, portions of the photoresist layer PR except for the first dissolvable region DR1 remain indissolvable, and are collectively referred as an indissolvable region IDR. In some embodiments, the first exposure may be performed by using a first photomask PM1. The first photomask PM1 covers the chip regions CR and the scribe line region SR, and has openings P1 for defining the first dissolvable region DR1. In other words, the openings P1 of the first photomask PM1 can expose the first dissolvable region DR1, and a body portion of the first photomask PM1 can be overlapped with the indissolvable region IDR along a vertical direction. Portions of the photoresist layer PR that are exposed by the openings P1 turn into a dissolvable state from an indissolvable state after being irradiated by light L, so as to form the first dissolvable region DR1. On the other hand, portions of the photoresist layer PR not being radiated by light L are the indissolvable region IDR. Some of the openings P1 of the first photomask PM1 are overlapped with the chip regions CR, and the others of the openings P1 are overlapped with the scribe line region SR. Accordingly, a distribution range of the first dissolvable region DR1 is overlapped with the chip regions CR and the scribe line region SR.

Figure 2E:
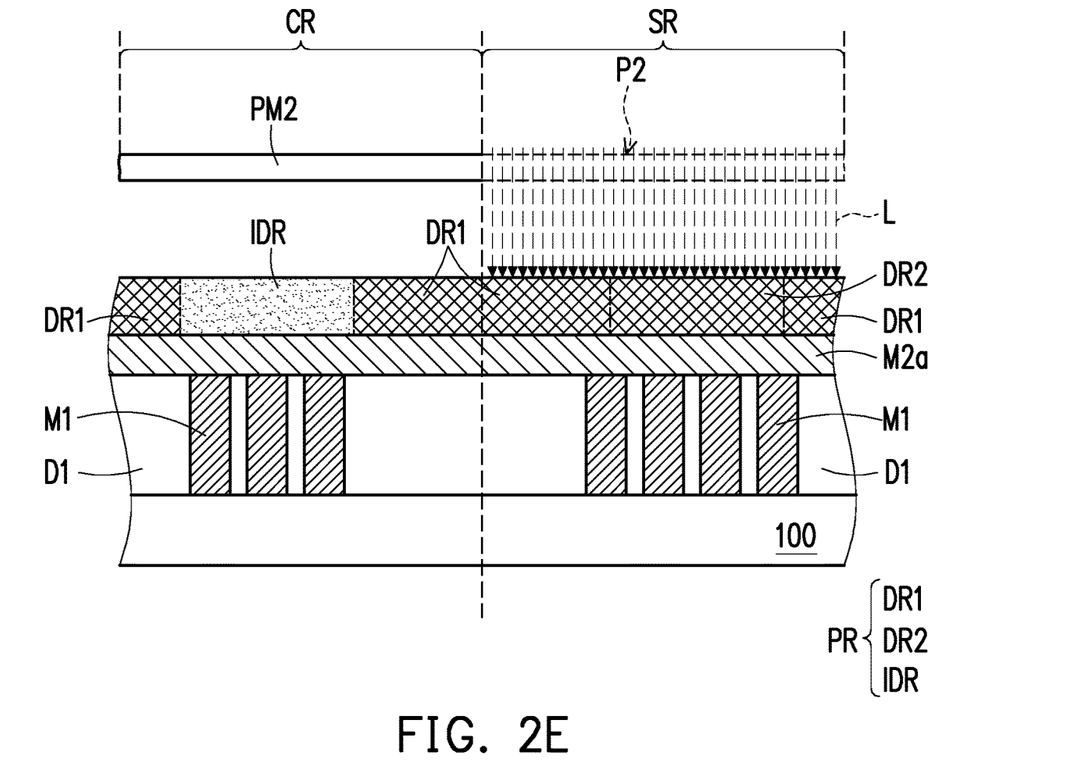

Referring to FIG. 1 and FIG. 2E, step S110 is performed, and a second exposure is performed on the photoresist layer PR. As such, the photoresist layer PR further has a second dissolvable region DR2 located within the scribe line region SR. In some embodiments, a distribution range of the second dissolvable region DR2 is not overlapped with the chip regions CR. Specifically, as a result of the second exposure, at least a portion of the indissolvable region IDR of the photoresist layer PR that is overlapped with the scribe line region SR turns into the second dissolvable region DR2. In some embodiments, as shown in FIG. 2D and FIG. 2E, all portions of the indissolvable region IDR within the scribe line region SR turn into the second dissolvable region DR2. In some embodiments, the second exposure may be performed by using a second photomask PM2. A body portion of the second photomask PM2 covers the chip regions CR, and the second photomask PM2 has a second opening P2 exposing substantially the whole scribe line region SR. In other words, the second opening P2 of the second photomask PM2 exposes portions of the first dissolvable region DR1 and the indissolvable region IDR within the scribe line region SR as shown in FIG. 2D. Light L passes through the opening P2 of the second photomask PM2 to irradiate the photoresist layer PR, such that the portions of the indissolvable region IDR of the photoresist layer PR within the scribe line region SR are able to turn into the second dissolvable region DR2, whereas the portions of the dissolvable region DR1 within the scribe line region remain dissolvable.

Referring to FIG. 2E, after the first exposure and the second exposure, substantially all of the portions of the photoresist layer PR within the scribe line region SR (i.e., including the portions of the first dissolvable region DR1 and the second dissolvable region DR2 within the scribe line region SR) turn into a dissolvable state. In some embodiments, the first dissolvable region DR1 is not overlapped with the second dissolvable region DR2. Additionally, in some embodiments, an area of the scribe line region SR is substantially equal to a total area of the portions of the first and second dissolvable regions DR1 and DR2 within the scribe line region SR. On the other hand, a portion of the photoresist layer PR within the chip regions CR (i.e., the portion of the first dissolvable region DR1 within the chip region CR) turns into a dissolvable state, whereas the other portion of the photoresist layer PR within the chip regions CR (i.e., the indissolvable region IDR as shown in FIG. 2E) remain indissolvable.

Figure 2F:
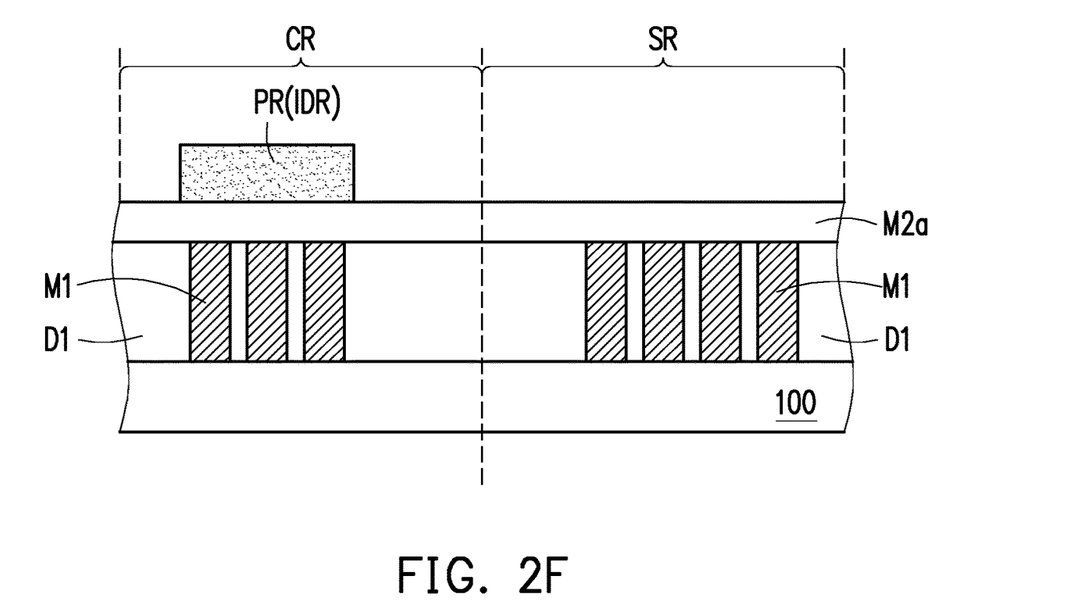

Referring to FIG. 1 and FIG. 2F, step S112 is performed to execute a development. As such, all of the dissolvable regions of the photoresist layer PR including the first dissolvable region DR1 and the second dissolvable region DR2 may be removed, whereas the indissolvable region IDR of the photoresist layer PR within the chip regions CR is remained. Accordingly, the remained portion of the photoresist layer PR (i.e., the indissolvable region IDR) is overlapped with a portion of the metal material layer M2a within the chip regions CR, while exposing the other portions of the metal material layer M2a. In some embodiments, the development process may be performed by any available development agent (also known as developer), the present invention is not limited thereto.

Figure 2G:
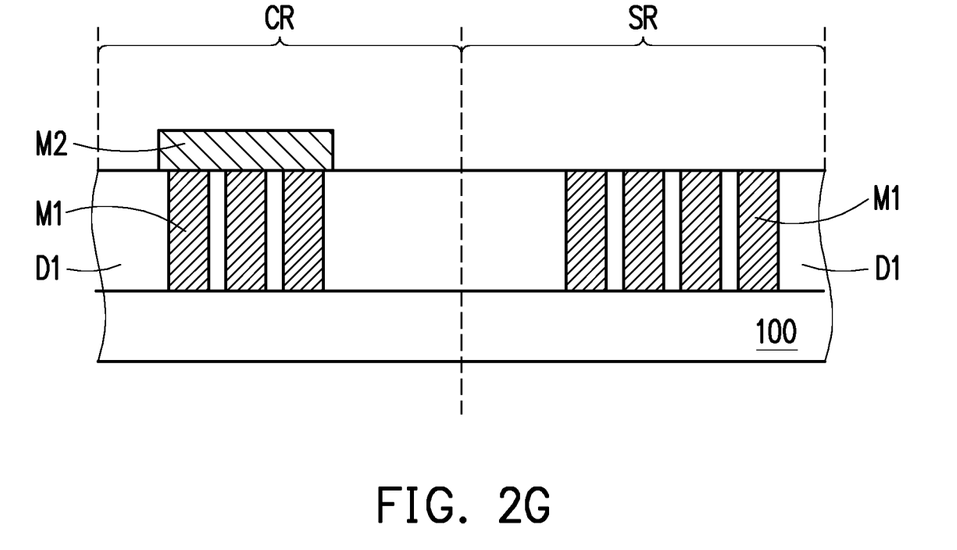

Referring to FIG. 1 and FIG. 2G, step S114 is performed, and a portion of the metal material layer M2a exposed by the remained portion of the photoresist layer PR (i.e., the indissolvable region IDR of the photoresist layer PR) is removed, and the second metal pattern M2 is formed. The remained portion of the photoresist layer PR is functioned as a mask while removing the exposed portion of the metal material layer M2a. A position of the second metal pattern M2 is in correspondence to a position of the remained portion of the photoresist layer PR (i.e., the indissolvable region IDR). In other words, the second metal pattern M2 is located within the chip regions CR, and the second metal pattern M2 is substantially absent in the scribe line region SR. In some embodiments, the second metal pattern M2 may be functioned as a horizontal interconnection structure.

Thereafter, the remained portion of the photoresist layer PR (i.e., the indissolvable region IDR of the photoresist layer PR) is removed. In some embodiments, the remained portion of the photoresist layer PR may be removed by an ashing process.

Figure 2H:
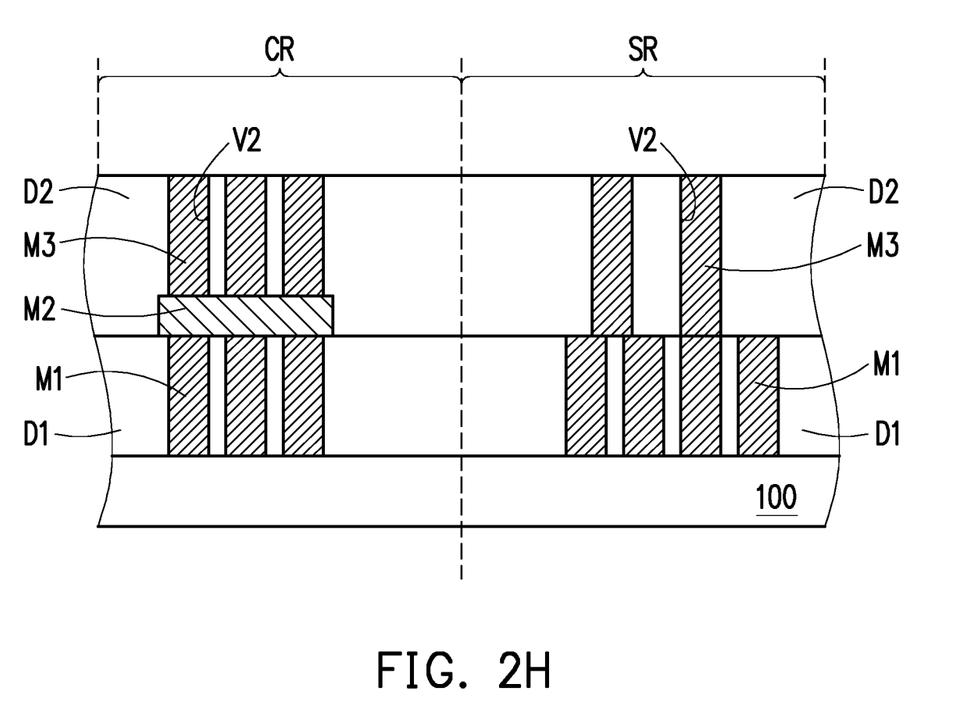

Referring to FIG. 1 and FIG. 2H, step S116 is performed, and a third metal pattern M3 is formed. Similar to the method of forming the first metal pattern M1, a dielectric layer D2 may be formed on the substrate 100, then the dielectric layer D2 is patterned to form a plurality of openings V2 therein. Some of the openings V2 is located within the chip regions CR, and expose the second metal pattern M2. The others of the openings V2 are located within the scribe line region SR. In some embodiments, those openings V2 within the scribe line region SR may expose the first metal pattern M1. In other embodiments, those openings V2 within the scribe line region SR may expose the dielectric layer D1, but not expose the first metal pattern M1. Afterward, the third metal pattern M3 is formed in the openings V2. Accordingly, a portion of the third metal pattern M3 covers a top surface of the second metal pattern M2 within the chip regions CR, and is electrically connected with the second metal pattern M2. The other portion of the third metal pattern M3 is located over the first metal pattern M1 within the scribe line region SR. The third metal pattern M3 may cover a top surface of the first metal pattern M1, or may not overlap with the first metal pattern M1. In some embodiments, the third metal pattern M3 and the first metal pattern M1 may be formed by the same material or by different materials. The present invention is not limited to the materials of the first and third metal patterns M1 and M3. For instance, a material of the third metal pattern M3 may include W. In addition, similar to the first metal pattern M1, the third metal pattern M3 may include conductive plugs or conductive vias.

Figure 2I:
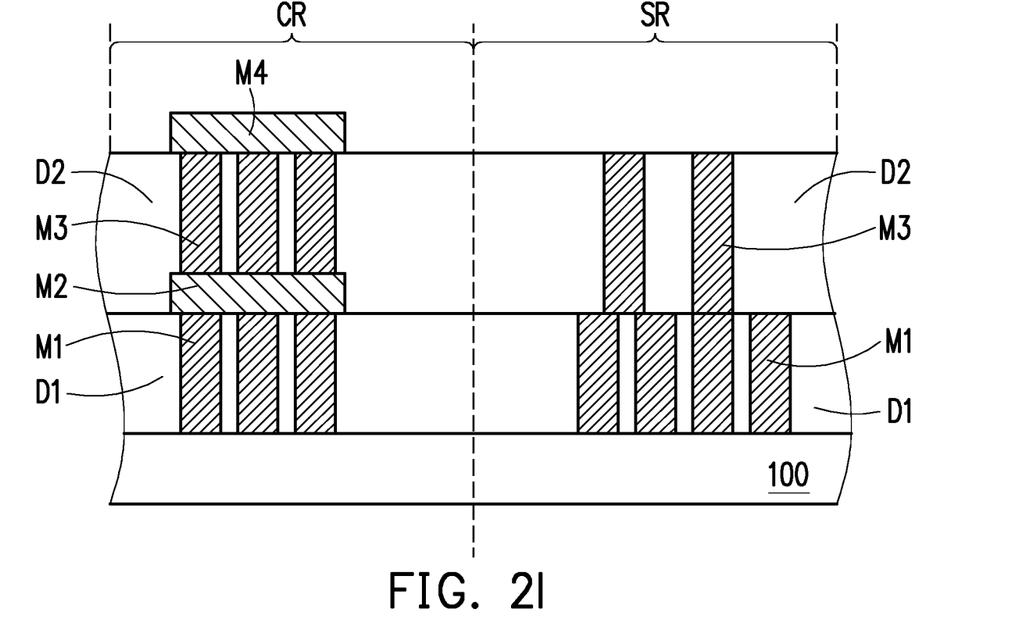

Referring to FIG. 1 and FIG. 2I, step S118 is optionally performed, and a fourth metal pattern M4 is formed over the third metal pattern M3 within the chip regions CR. In some embodiments, a formation method of the fourth metal pattern M4 is similar to the formation method of the second metal pattern M2 (as shown in FIG. 2B through FIG. 2G), and will not be repeated again. The fourth metal pattern M4 is located within the chip regions CR, and is substantially absent within the scribe line region SR. In some embodiments, the fourth metal pattern M4 covers a top surface of the third metal pattern M3, and is electrically connected with the third metal pattern M3. The fourth metal pattern M4 includes a material that is difficult to be etched or possible to generate a barely etchable byproduct while being etched with a silicon-based material. For instance, the material of the fourth metal pattern M4 may include Al. In addition, the fourth metal pattern M4 may be functioned as a horizontal interconnection structure.

In some embodiments, the same second photomask PM2 may be applied for forming the second metal pattern M2 and the fourth metal pattern M4. In other words, during the formation of the second and fourth metal patterns M2 and M4, substantially all portions of the metal material layer within the scribe line region SR may be removed. As such, the formed second and fourth metal patterns M2 and M4 are both located within the chip regions CR. On the other hand, the same or different first photomasks PM1 may be applied for forming the second and fourth metal patterns M2 and M4. Thus, a top view profile of the second metal pattern M2 may be the same as a top view profile of the fourth metal pattern M4, or different from the profile of the fourth metal pattern M4.

In some embodiments, a structure within the chip regions CR that includes the first metal pattern M1 through the fourth metal pattern M4 may be functioned as an interconnection structure, a seal ring, a redistribution structure, the like or combinations thereof. On the other hand, a structure within the scribe line region SR that includes the first metal pattern M1 and the third metal pattern M3 may be a broken part of a test element group (TEG). A complete structure of the TEG may include the portions of the first metal pattern M1 and the third metal pattern M3 within the scribe line region SR, and would have further included portions of the second metal pattern M2 and the fourth metal pattern M4 that are removed. As such, the structure within the scribe line region SR that includes the first metal pattern M1 and the third metal pattern M3 is not a complete TEG, and may merely provide limited test functions.

Figure 2J:
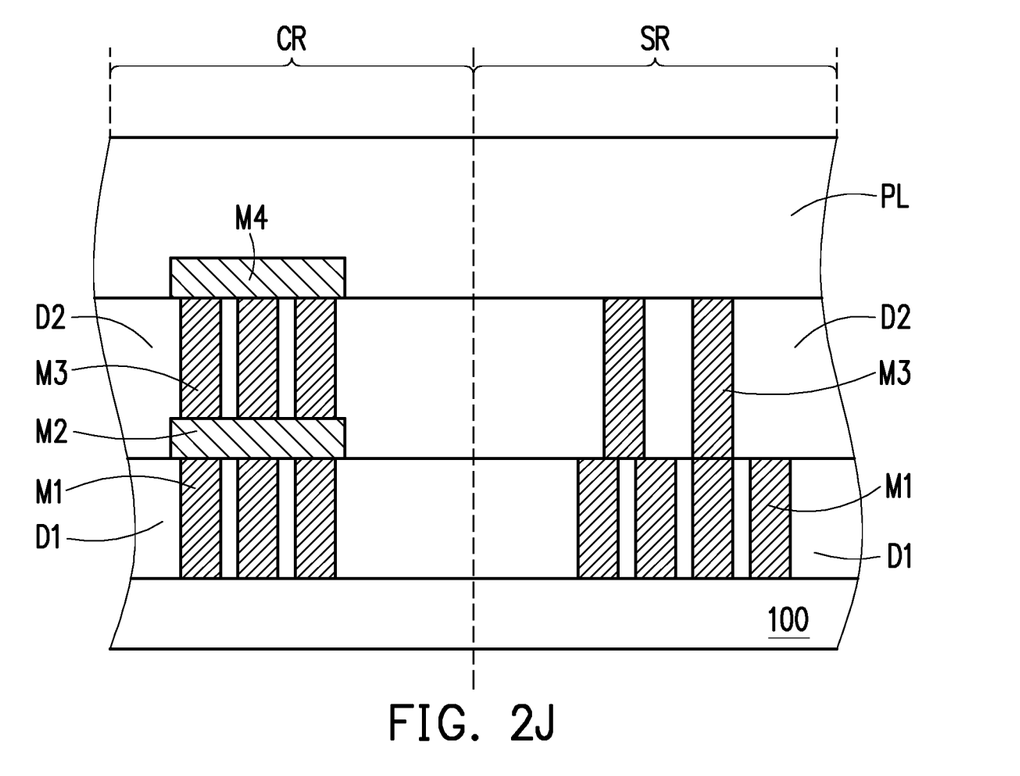

Referring to FIG. 1 and FIG. 2J, step S120 is optionally performed, and a passivation layer PL is formed over the substrate 100. The passivation layer PL may by formed within the chip regions CR and the scribe line region SR. In some embodiments, a portion of the passivation layer PL within the chip region CR covers the top surfaces of the fourth metal pattern M4 and the dielectric layer D2, whereas the other portion of the passivation layer PL within the scribe line region SR covers the top surfaces of the third metal pattern M3 and the dielectric layer D2. In some embodiments, a material of the passivation layer PL may include silicon nitride, silicon oxide, silicon oxynitride or the like. A formation method of the passivation layer P1 may include a CVD method.

Figure 2K:
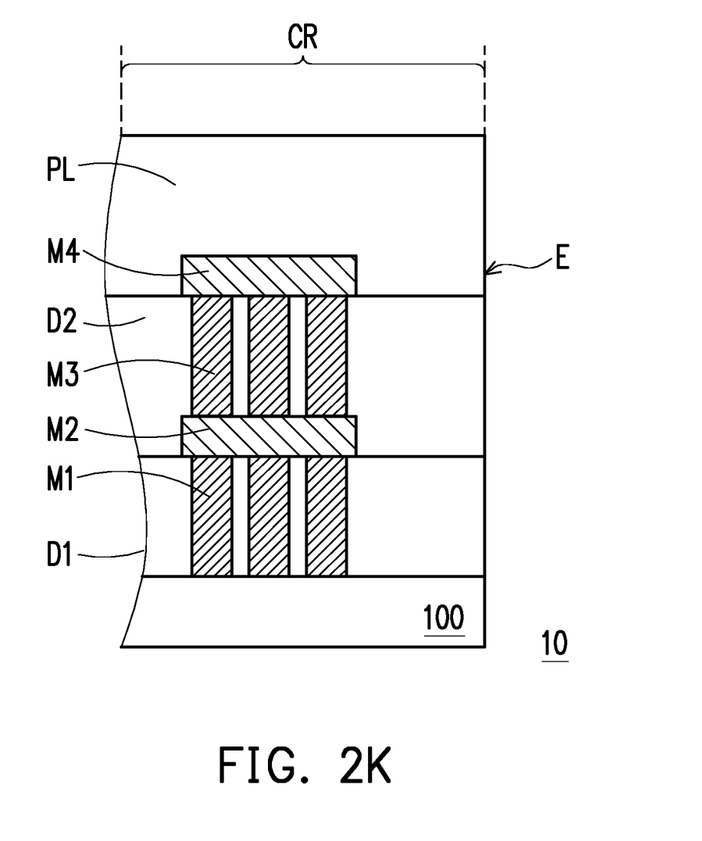

Referring to FIG. 1 and FIG. 2K, step S122 is performed, and a singulation process is performed along the scribe line region SR, so as to form the semiconductor chip 10. In some embodiments, a method of the singulation includes a plasma dicing process. The plasma dicing process may include a plurality of etching-deposition-cleaning cycles, and may referred as a Bosch process. Since the material within the scribe line region SR that would hinder the etching step (e.g., the second metal pattern M2 and the fourth metal pattern M4) has been removed, the singulation can be successfully performed by the plasma dicing process. In some embodiments, an edge E of the semiconductor chip 10 obtained after the singulation process is an interface between adjacent chip region CR and scribe line region SR.

As above, the material within the scribe line region that may hinder an etching process is removed during the formation of the semiconductor chip according to embodiments of the present invention, so that the singulation process (e.g., plasma dicing) can be successfully performed. Therefore, yield and throughput of the manufacture process of the semiconductor chip is improved. In some embodiments, a method of removing this material within the scribe line region includes two exposure steps. The first exposure step is applied for defining an initial pattern of this material within both of the chip regions and the scribe line region, and the second exposure step is applied for removing a portion of this pattern within the scribe line region. Accordingly, a final pattern only remained within the chip region, and is substantially absent within the scribe line region. In these embodiments, only an additional exposure process is required for removing this material from the scribe line region, and modification on the existing photomask is not required. In addition, a predetermined pattern of this material within the chip regions is not influenced. As a result, it can be avoided from greatly raising manufacturing cost of the semiconductor chip.

In some embodiments, the steps of forming the pattern only existed within the chip region may be repeated a couple of times, and the same photomask can be applied for performing the second exposures (as shown in FIG. 2E) in these steps. Before indicators of the semiconductor chip such as yield, efficiency, reliability or the like reach a predetermined level, the step(s) of the second exposure (as shown in FIG. 2E) may not be performed. As such, a complete TEG may be formed in the scribe line region, so as to be applied for inspection on the semiconductor chip. Once the manufacturing process of the semiconductor chip reaches a steady state (i.e., those indicators have reached the predetermined level), inspection on the semiconductor chip is no longer required. At this time, step(s) of the second exposure may be included in the manufacturing method of the semiconductor chip to remove this material within the scribe line region that may hinder an etching process, in order to improve an yield of the plasma dicing process. Moreover, the same photomask can be applied for multiple second exposures to save manufacturing cost.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor chip, comprising:
    forming a first metal pattern over a substrate, wherein the first metal pattern is located within a chip region and a scribe line region of the substrate, and the chip region is surrounded by the scribe line region;
    forming a metal material layer over the first metal pattern, wherein the metal material layer covers the first metal pattern within the chip region and the scribe line region;
    patterning the metal material layer by at least one lithography process and an etching process, to remove all portions of the metal material layer located within the scribe line region and a portion of the metal material layer located within the chip region, so as to form a second metal pattern located within the chip region;
    forming a third metal pattern, wherein the third metal pattern covers the second metal pattern within the chip region, and is located over a portion of the first metal pattern located within the scribe line region, and wherein a bottom surface of a portion of the third metal pattern within the scribe line region is leveled with a top surface of a portion of the first metal pattern within the scribe line region; and
    performing a singulation along the scribe line region, so as to form the semiconductor chip.

2. The manufacturing method of the semiconductor chip as claimed in claim 1, wherein a method of patterning the metal material layer comprises:
    forming a photoresist layer over the metal material layer;
    performing a first exposure on the photoresist layer, such that the photoresist layer has a first dissolvable region, wherein a distribution range of the first dissolvable region is overlapped with the chip region and the scribe line region;
    performing a second exposure on the photoresist layer, such that the photoresist layer further has a second dissolvable region, wherein the second dissolvable region is located within the scribe line region;
    performing a development, to remove the first dissolvable region and the second dissolvable region of the photoresist layer, so as to expose the metal material layer;
    removing the exposed portion of the metal material layer by using the remained portion of the photoresist layer as a mask, so as to form the second metal pattern; and
    removing the remained portion of the photoresist layer.

3. The manufacturing method of the semiconductor chip as claimed in claim 2, wherein the photoresist layer comprises a positive-tone photoresist material.

4. The manufacturing method of the semiconductor chip as claimed in claim 2, wherein the first dissolvable region is not overlapped with the second dissolvable region.

5. The manufacturing method of the semiconductor chip as claimed in claim 2, wherein a distribution range of the second dissolvable region is not overlapped with the chip region.

6. The manufacturing method of the semiconductor chip as claimed in claim 2, wherein an area of the scribe line region is equal to a total area of the second dissolvable region and a portion of the first dissolvable region located within the scribe line region.

7. The manufacturing method of the semiconductor chip as claimed in claim 1, wherein the third metal pattern is electrically connected with the second metal pattern within the chip region.

8. The manufacturing method of the semiconductor chip as claimed in claim 1, wherein a method of performing the singulation comprises a plasma dicing process.

9. The manufacturing method of the semiconductor chip as claimed in claim 1, wherein a material of the second metal pattern comprises Al.

10. The manufacturing method of the semiconductor chip as claimed in claim 1, wherein materials of the first metal pattern and the third metal pattern comprise W.

11. The manufacturing method of the semiconductor chip as claimed in claim 2, further comprising: repeating forming the metal material layer and patterning the metal material layer a plurality of times, wherein the same photomask is applied for a plurality of times of the second exposure.

12. The manufacturing method of the semiconductor chip as claimed in claim 1, wherein a thickness of the portion of the third metal pattern within the scribe line region is greater than a thickness of another portion of the third metal pattern within the chip region.

\* \* \* \* \*